United States Patent [19]
Parks et al.

[11] Patent Number: 4,889,411
[45] Date of Patent: Dec. 26, 1989

[54] PROCESS AND STRUCTURE FOR THIN FILM TRANSISTOR WITH ALUMINUM CONTACTS AND NONALUMINUM METALLIZATION IN LIQUID CRYSTAL DISPLAYS

[75] Inventors: Harold G. Parks; William W. Piper, both of Scotia; George E. Possin; Donald E. Castleberry, both of Schenectady, all of N.Y.

[73] Assignee: General Electric Company, Schenectady, N.Y.

[21] Appl. No.: 335,262

[22] Filed: Apr. 10, 1989

Related U.S. Application Data

[60] Division of Ser. No. 241,271, Sep. 7, 1988, Pat. No. 4,855,806, which is a continuation of Ser. No. 127,024, Nov. 30, 1987, abandoned, which is a continuation of Ser. No. 761,939, Aug. 2, 1985, abandoned.

[51] Int. Cl.$^4$ ............................................. G02F 1/133
[52] U.S. Cl. ..................................... 350/334; 350/333; 350/320
[58] Field of Search ................ 350/332, 333, 334, 320; 357/23.7

[56] References Cited

U.S. PATENT DOCUMENTS

| | | | |
|---|---|---|---|
| 4,666,253 | 5/1987 | Yoshida | 350/334 |
| 4,704,002 | 11/1987 | Kikuchi et al. | 350/334 |

Primary Examiner—John S. Heyman
Assistant Examiner—Napoleon Thantu
Attorney, Agent, or Firm—Marvin Snyder; James C. Davis, Jr.

[57] ABSTRACT

A thin film FET switching element, particularly useful in liquid crystal displays, employs a set of special materials to ensure compatibility with the indium tin oxide of a pixel electrode layer used as transparent conductive material in liquid crystal display devices. These materials include the use of titanium as a gate electrode material and the use of aluminum as a material to enhance electrical contact between source and drain pads and an underlying layer of amorphous silicon. The apparatus and process of the present invention provide enhanced fabrication yield and device reliability.

17 Claims, 5 Drawing Sheets

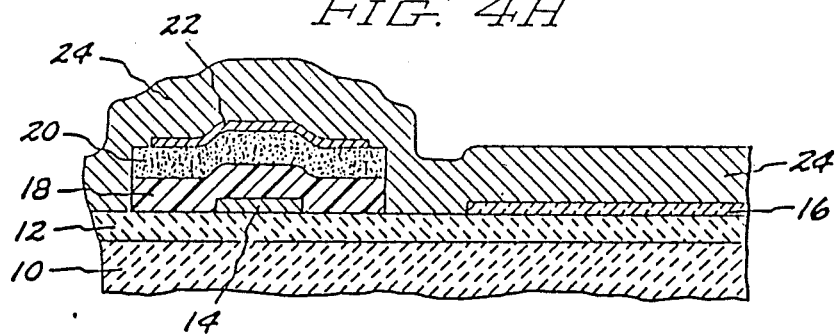
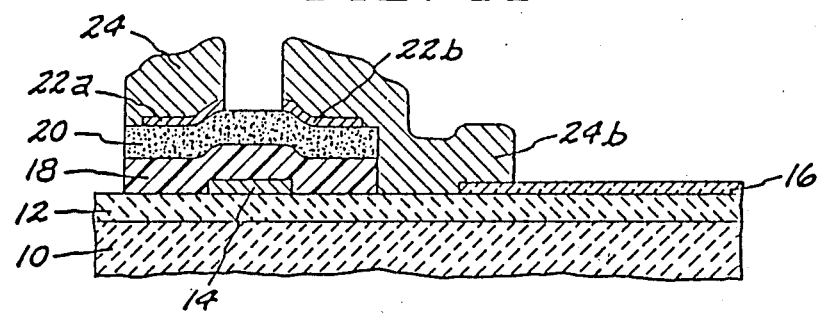
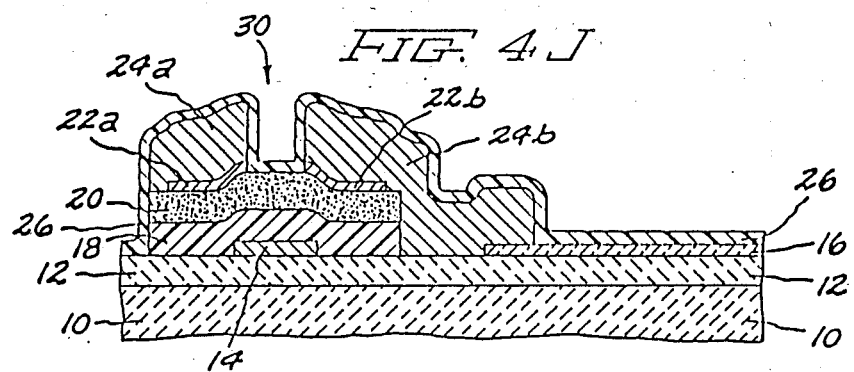

PROCESS AND STRUCTURE FOR THIN FILM TRANSISTOR WITH ALUMINUM CONTACTS AND NONALUMINUM METALLIZATION IN LIQUID CRYSTAL DISPLAYS

This application is a division of application Ser. No. 241,271, filed Sept. 7, 1988, Pat. No. 4,855,806, which is a continuation of application Ser. No. 127,024, filed Nov. 30, 1987, now abandoned, which is a continuation of application Ser. No. 761,939, filed Aug. 2, 1985, now abandoned.

BACKGROUND OF THE INVENTION

The present invention is generally directed to a structure and process for the fabrication of thin film field effect transistors employed in matrix addressed liquid crystal displays. More particularly, the present invention is directed to the utilization of specific materials in the field effect transistor (FET) fabrication process and structure. Even more particularly, the present invention is directed to the solution of material compatibility problems between aluminum contacts on amorphous silicon and indium tin oxide as a transparent electrode material.

A liquid crystal display device typically comprises a pair of flat panels sealed at their outer edges and containing a quantity of liquid crystal material. These liquid crystal materials typically fall into two categories: dichroic dyes and a guest/host system or twisted nematic materials. The flat panels generally possess transparent electrode material disposed on their inner surfaces in predetermined patterns. One panel is often covered completely by a single transparent "ground plane" electrode. The opposite panel is configured with an array of transparent electrodes, referred to herein as "pixel" (picture element) electrodes. Thus, a typical cell in a liquid crystal display includes liquid crystal material disposed between a pixel electrode and a ground electrode forming, in effect, a capacitor like structure disposed between transparent front and back panels. In general, however, transparency is only required for one of the two panels and the electrodes disposed thereon.

In operation, the orientation of liquid crystal material is affected by voltages applied across the electrodes on either side of the liquid crystal material. Typically, voltage applied to the pixel electrode effects a change in the optical properties of the liquid crystal material. This optical change causes the display of information on the liquid crystal display (LCD) screen. In conventional digital watch displays and in newer LCD display screens used in some miniature television receivers, the visual effect is typically produced by variations in reflected light. However, the utilization of transparent front and back panels and transparent electrodes also permits the visual effects to be produced by transmissive effects. These transmissive effects may be facilitated by separately powered light sources for the display, including fluorescent light type devices. LCD display screens may also be employed to produce color images through the incorporation of color filter mosaics in registration with the pixel electrode array. Some of the structures may employ polarizing filters to either enhance or provide the desired visual effect.

Various electrical mechanisms are employed to sequentially turn on and off individual pixel elements in an LCD display. For example, metal oxide varistor devices have been employed for this purpose. However, the utilization of thin film semiconductor switch elements is most relevant herein. In particular, the switch element of the present invention comprises a thin film field effect transistor employing a layer of amorphous silicon. These devices are preferred in LCD devices because of their potentially small size, low power consumption, switching speeds, ease of fabrication, and compatibility with conventional LCD structures. However, fabrication processes for certain desired semiconductor switch element structures have been found to be incompatible with the employment of certain materials used in the transparent LCD electrodes. More particularly, it has been found that it is desirable to employ an aluminum layer as the source and drain electrodes of the FET fabricated using amorphous silicon since conventional electrode materials, such as molybdenum, do not bond as well to amorphous silicon and may be more difficult to pattern. Investigations by the present inventors have indicated that good source and drain contacts to intrinsic silicon are most reliably obtained with aluminum metallization. Unfortunately, attempts at fabricating an LCD array has revealed a materials compatibility problem between aluminum and the indium tin oxide pixel electrode. A deterioration in the indium tin oxide (ITO) pixel electrodes resulted when aluminum, ITO and etchants, resist developer, or other aqueous solutions were simultaneously in contact. The result is a "Swiss cheese" appearance of the indium tin oxide layer. Accordingly, the problem addressed by the present application is that of devising a process that allows the advantages of aluminum source drain contact material while avoiding material compatibility problems, in a simple way, employing as few masking steps as possible. The number of masking steps is desired to be low since, in general, the greater the process complexity, the lower is the reliability of the resultant device and the process yield.

There is a large amount of literature describing amorphous silicon field effect transistors. Some of the literature that describes aluminum source drain FETs also discusses device properties with mere suggestions for display purpose applications. Other literature that describes display applications typically does not specify source or drain material but indicates cross sections showing that similar source-drain/ITO material compatibility problems have been experienced. The problem with the processes involved in these devices and others that have been considered by the present inventors is that they require as many as eight masking steps and thus require an extremely clean processing environment to achieve high production yields for LCD devices. As display size and complexity increases, these yield problems become more significant.

Articles in this vein have included the following: "Application of Amorphous Silicon Field Effect Transistors and Integrated Circuits" by AJ Snell et al., Applied Physics, Volume 26, pages 83–86 (1981); "Amorphous Silicon - Silicon Nitride Thin Film Transistors", by MJ Powell, Applied Physics Letters, Volume 38, No. 10 (May 1981); "Silicon TFT's for Flat Panel Displays" by F. Morin and M. LeContellec, Hewlett Packard Journal; "Application of Amorphous Silicon Field Effect Transistors in Addressable Liquid Crystal Display Panels", by GJ Snell et al., Applied Physics, Volume 24, pages 357–362 (1981); "A TFT-Addressed Liquid Color Display" by M. Sugatr et al., Proceedings of the Third International Display Research Conference, SID and ITE, Paper No. 5.3 (October 1983) and "Amorphous-Silicon Thin-Film Metal-Oxide-Semiconductor Transistors" by H. Hayama and M. Matsumura, Applied Physics Letters, Volume 36, No. 9 (May 1980).

SUMMARY OF THE INVENTION

In accordance with a preferred embodiment of the present invention, a process for the fabrication of thin film field effect transistors comprises a multistep process employing titanium as a gate electrode material, indium tin oxide as a pixel electrode material, and aluminum as a means for bonding source and drain electrodes to an amorphous silicon surface. In the process of the present invention, a gate metallization pattern layer is disposed on an insulating substrate. For material compatibility reasons, the gate layer comprises titanium. An indium tin oxide pixel electrode pattern is then disposed on the substrate followed by a layer of silicon nitride, a layer of amorphous silicon and a layer of aluminum. The aluminum layer is patterned to form an island structure which eventually comprises the source and drain portions of the FET. It is important to note herein that the aluminum layer is patterned with the silicon nitride layer in place over the indium tin oxide, thus protecting the pixel electrode from the above mentioned "Swiss cheese" effect. The silicon nitride and amorphous silicon layers are then also patterned to form islands which include the source and drain pattern of the aluminum, thus producing a structure in which each island formed includes a layer of silicon nitride, amorphous silicon, and aluminum. Source and drain metallization is then applied over the substrate and this layer is patterned to provide source and drain contacts in electrical connection with the aluminum and at the same time, the patterning of the source and drain electrodes results in the formation of source (data) and drain lines. Either the source or drain lines are connected so as to be in electrical contact with the individual pixel electrodes, the other of these two FET electrodes being connected to the data lines. The gate electrodes are connected to the gate drive lines.

Accordingly, it is an object of the present invention to provide a process for the fabrication of thin film field effect transistors.

It is a further object of the present invention to provide a structure and process for thin film field effect transistor fabrication in conjunction with the fabrication of liquid crystal display devices.

It is yet another object of the present invention to provide an active matrix LCD display exhibiting improved source drain metallization contact to underlying amorphous silicon material.

It is a still further object of the present invention to provide material, structures and processes exhibiting chemical compatibility, particularly with respect to etchants, to reduce degradation in pixel electrodes in LCD devices.

Lastly, but not limited hereto, it is an object of the present invention to provide a process and structure for the fabrication of thin film field effect transistors and associated LCD display devices exhibiting increased manufacturing yield and more reliable components and displays.

DESCRIPTION OF THE DRAWINGS

The subject matter which is regarded as the invention is particularly pointed out and distinctly claimed in the concluding portion of the specification. The invention itself, however, both as to organization and method of practice, together with further objects and advantages thereof, may best be understood by reference to the following description taken in connection with the accompanying drawings in which:

FIGS. 4A-4J are cross sectional side elevation views illustrating sequential steps in the fabrication of the FET structure and LCD structure of the present invention.

DETAILED DESCRIPTION OF THE INVENTION

Figure 1:
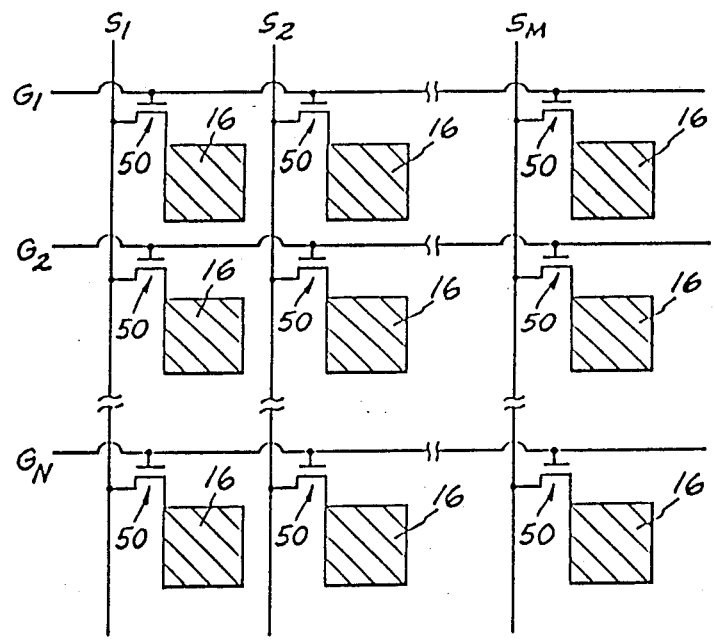
FIG. 1 is a schematic electrical circuit diagram illustrating the context in which the thin film FETs of the present invention are employed.

FIG. 1 illustrates, in schematic diagram form, a matrix addressed liquid crystal display circuit. In particular there is shown an N by M array of pixel electrodes 16 together with associated FET switching elements 50. The gate electrodes of the switching elements in row i are connected to gate drive line $G_i$. Likewise, the source electrode in each column j is connected to data or source line $S_j$. In the figure shown, j ranges from 1 to M and i ranges from 1 to N. It should be realized, however, that many FET structures are symmetric with respect to source and drain properties and that in many situations the source and drain connections can be reversed. However, FIG. 1 particularly shows each pixel electrode 16 being connected to the drain of its associated switching FET. In operation, the pixel element in the $i^{th}$ row and $j^{th}$ column is switched on by simultaneously applying appropriate signals to gate line $G_i$ and data line $S_j$. This applies a voltage to pixel electrodes 16 which acts to alter the optical properties of liquid crystal materials disposed between pixel electrode 16 and the ground plane or counter electrode (not visible in FIG. 1). Pixel electrodes 16 comprise a transparent conductive material such as indium tin oxide. However, processing of amorphous silicon field effect transistors, as conventionally carried out, is inconsistent with the use of certain etchants for aluminum which is particularly useful for enhancing electrical contact to amorphous silicon. It is, therefore, seen that certain material components which are desirable in amorphous silicon FET structures result in processing and fabrication difficulties wherever these FET structures are employed in liquid crystal displays employing indium tin oxide as pixel electrode material.

Figure 2:
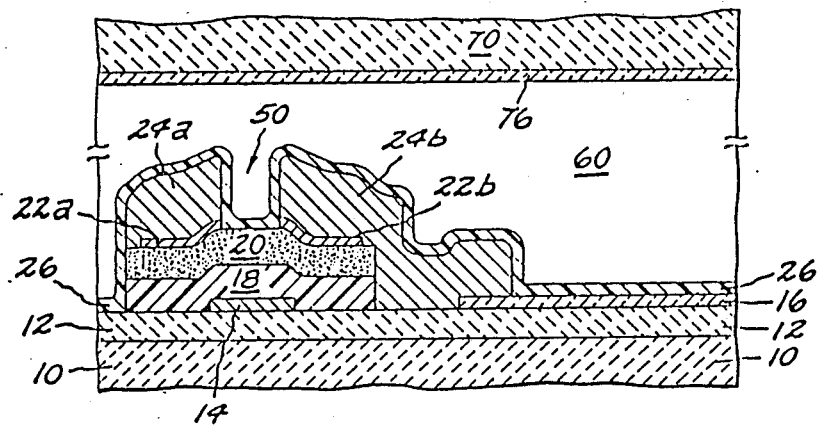
FIG. 2 is a cross sectional side elevation view of a portion of an LCD pixel cell including the FET structure of present invention.

FIG. 2 illustrates a portion of a liquid crystal display device in accordance with the present invention. More particularly, FIG. 2 illustrates both the upper and lower panel for an LCD display. Also illustrated is the physical relationship between the FET structure and a pixel electrode. In FIG. 2 there is shown upper LCD panel 70 which typically comprises a material such as glass. Also disposed on the lower surface of panel 70 is a thin coating of a material such as indium tin oxide 76 which acts as a transparent counter electrode or ground plane electrode. Electrical potential differences appearing between ground plane electrode 76 and pixel electrode 16 produce optical variations in liquid crystal material 60 disposed between these electrodes. It is the optical effects produced by this potential difference which cause information to be displayed on the LCD device. FET 50 and pixel electrode 16 are disposed on an insulative coating 12 on lower LCD display panel 10. Coating 12 typically comprises a material such as silicon dioxide. Panel 10 typically comprises a material such as glass. In general, panel 70, panel electrodes 76, pixel electrode 16, coating 12 and panel 10 may all comprise transparent material. This is particularly useful in LCD displays in which back lighting is employed to form the desired image. However, it is only necessary for either upper panel 70 or lower substrate 10, together with its associated electrode coating, to be transparent.

As indicated above, pixel electrodes 16 are disposed on one of the LCD display panels. It is also necessary to connect each pixel electrode 16 with its associated semiconductor switching element. In the present application, semiconductor switching element 50 comprises an amorphous-silicon-based field effect transistor which includes gate electrode 14 preferably comprising titanium. Over gate electrode 14, there is disposed an insulating layer 18, typically comprising a material such as silicon nitride. Over insulating layer 18, there is disposed an active layer of amorphous silicon 20. In general, it is desirable to dispose source and drain electrodes in direct contact with active silicon material. However, materials such as molybdenum employed in the source and drain metallization layer may not form good electrical contact with intrinsic amorphous silicon. Accordingly, it is therefore desirable to employ an intermediary contact metal to facilitate and enhance the electrical connection to the amorphous silicon. In the present invention, this includes the utilization of aluminum coatings 22a and 22b for source electrodes 24a and 24b, respectively. At the same time, drain electrode 24b and source electrode 24a are fabricated and disposed so as to provide electrical contact to pixel electrode 16, as shown. Finally, a layer of passivation material 26, such as silicon nitride is disposed over the lower LCD display substrate.

It should also be noted from FIG. 2 that gate electrode 14, together with the associated gate drive lines are in contact with layer 12 as is indium tin oxide layer 16. If these layers are to be deposited at approximately the same step in the fabrication process, the materials chosen for these layers must exhibit some degree of compatibility. This is particularly true with respect to etchants employed in patterning these layers. Accordingly, the structure and process of the present invention employs titanium as a gate electrode material and indium tin oxide as a transparent pixel electrode material. Note, however, that these compatibility problems do not apply to the ground plane electrode disposed on upper substrate 70.

Figure 3A:
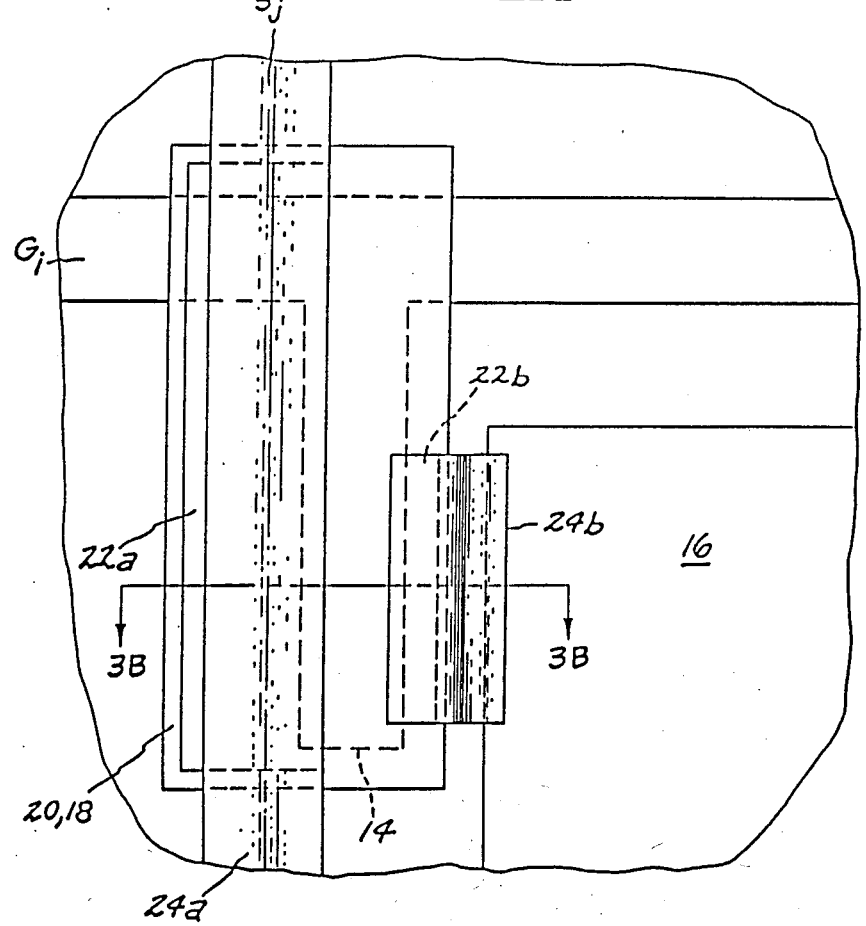
FIG. 3A is a plan view of an FET and a portion of a pixel electrode, in accordance with the present invention.

FIG. 3A is a plan view detailing the physical structure of a switching element 50 and its associated pixel electrode 16 in the vicinity of the intersection of gate drive line $G_i$ and data drive line $S_j$. For completeness, corresponding structures are illustrated in cross-section in FIG. 3B. In particular, FIG. 3A illustrates the presence of an insulative island principally comprising insulative layer 18 and amorphous silicon layer 20. This island provides insulation between data line $S_j$ and gate line $G_i$. It is also seen that data line $S_j$ may also serve directly as the source electrode (or the drain electrode in a reverse situation) for a thin film FET. It is also seen that gate electrode 14 is preferably provided as an extension of gate drive line $G_i$. The gate drive lines and the gate electrodes are most preferably fabricated in the same process step and comprise the same material and in this particular invention, titanium is employed to ensure compatibility with indium tin oxide pixel electrode 16.

Figure 3B:
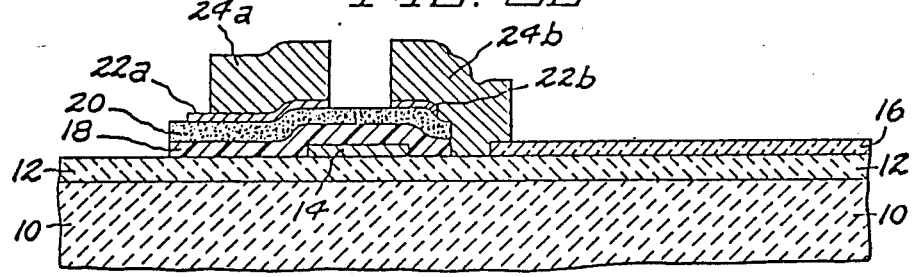
FIG. 3B is a cross sectional side elevation view which more particularly illustrates alignment of the FET structure with portions shown in the plan view of FIG. 3A.

Since the gate electrode is fabricated in an early process step and is disposed on the underlying insulative substrate and since the gate insulation layer also insulates the gate and source electrodes, the FET structures shown in FIGS. 2 and 3B are described as being inverted FETs. This term, however, applies only to their physical rather than electrical properties.

Although it may appear that the structure shown in FIGS. 1, 2 and 3 is readily constructable, it must also be appreciated that there are significant material and material etchant compatibility problems involved in fabricating the structure shown. The process of the present invention employs materials and steps which overcome these compatibility problems and at the same time results in a fabrication process employing a minimal number of masking operations. The use of a large number of masking operations is, in general, to be avoided because of the problems of device reliability and yield. Accordingly, FIGS. 4A through 4J illustrate various steps in the fabrication of the device shown in FIGS. 1 through 3. In particular, the fabrication process illustrated in these figures is directed to the production of thin film amorphous silicon based FET switching element devices which are compatible with the utilization of indium tin oxide as a transparent electrode material.

In the process in accordance with the present invention, an insulative substrate such as glass is cleaned in order to bring the surface up to processing quality. Insulative coating 12 such as a layer of silicon oxide is then provided on one side of substrate 10 to provide a stable surface for further processing. However, layer 12 can optionally be removed.

Insulative coating 12 typically comprises a layer of silicon oxide sputter deposited to a thickness of approximately 1,200 Angstroms.

Titanium is then deposited, patterned and plasma etched to form the gates of the FETs and the gate drive lines. The deposition of the gate drive lines on insulative coating 12 is generally performed in accordance with conventional masking and patterning techniques. For example, a layer of titanium may be deposited by electron beam evaporation to a thickness of approximately 800 Angstroms. This layer is coated with a resist and exposed to the desired masking pattern. The substrate is then plasma etched to form the gate patterns. In a preferred embodiment of the present invention, oxygen ashing of the resist is carried out at this step and performs a dual purpose, namely, cleaning off the resist as well as exposing the gate metal to an oxygen environment which toughens it prior to plasma etching during island definition.

Figure 4A:
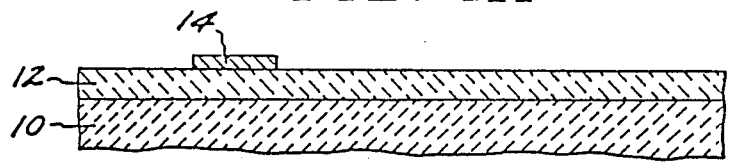
Figure 4B:
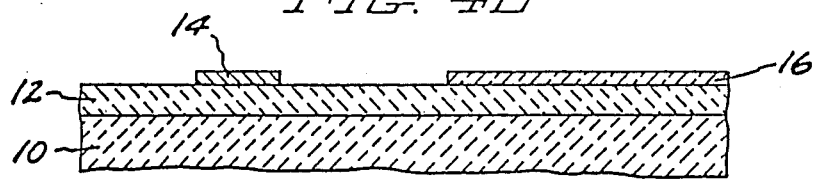

FIG. 4B illustrates the next step in the process of the present invention. In this step, indium tin oxide pixel electrode material 16 is sputter deposited and wet etched. The process step illustrated in FIG. 4B, therefore, represents the second masking step employed in the present invention. The formation of the pixel electrodes is performed after the formation of the gate metallization pattern to avoid exposure to the etchants used to pattern the gate material. The material of pixel electrode 16 is preferably deposited by sputter deposition of indium tin oxide to a thickness of approximately 900 Angstroms.

Figure 4C:
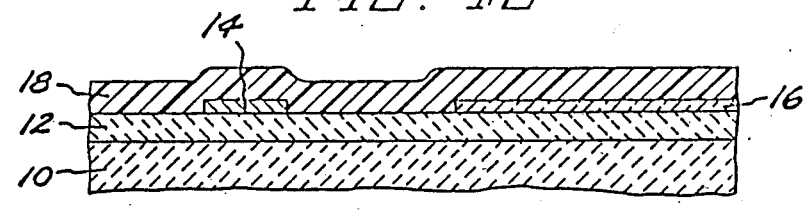
Figure 4D:
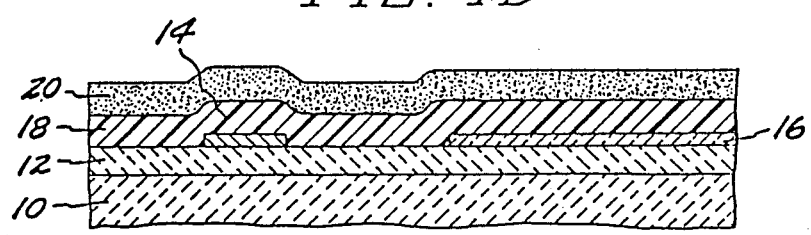
Figure 4E:
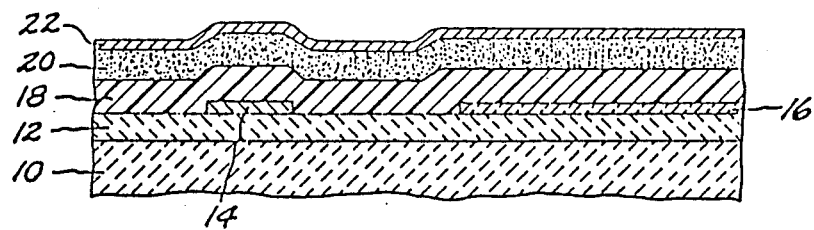

FIG. 4C illustrates the next step in the process of the present invention which comprises deposition of insulating layer 18. This layer preferably comprises silicon nitride which is preferably formed by plasma enhanced chemical vapor deposition (PECVD) to a thickness of approximately 1,500 Angstroms. Next, an amorphous silicon layer is likewise deposited to a thickness of approximately 2,000 Angstroms. For a general description of the PECVD process see "Plasma-promoted Deposition of Thin Inorganic Films" by M. Rand in J. Vac. Sci. Tech., Vol. 16, page 420 (1979). Although it is significantly less desirable, it is also possible to form the amorphous silicon layer by sputtering and subsequent hydrogenation. An important aspect of the process of the present invention is that the next layer of aluminum be deposited relatively immediately following the amorphous silicon deposition in order to achieve reliable contact. This is very desirable because of oxidation and contamination of the silicon surface which could occur otherwise. With respect to the immediacy of the deposition of aluminum, it is pointed out that this deposition occur prior to any other surface treatment. For example, it is undesirable to delay deposition of aluminum for longer than approximately 2 hours if the substrate surface is exposed to air. Maintenance of the substrate in inert atmosphere would, of course, prolong this period of time. Nonetheless, since it is an object of the present invention to ensure good contact with the amorphous silicon material, it is generally better to deposit the aluminum layer as soon as practical without subsequent surface treatment. The deposition of amorphous silicon layer 20 is illustrated in FIG. 4D and the electron beam evaporation of aluminum layer 22 is illustrated in FIG. 4E. The aluminum is typically deposited to a thickness of approximately 500 Angstroms. The amorphous silicon layer is preferably deposited by plasma deposition to a thickness of approximately 2,000 Angstroms. The resulting structure is shown in FIG. 4E.

Figure 4F:
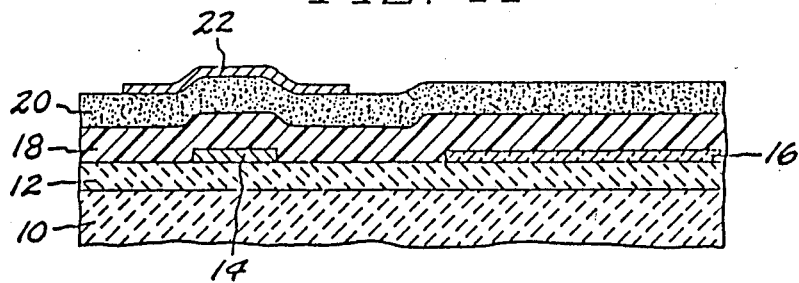

FIG. 4F illustrates that the next step in the process is the patterning of aluminum layer 22 so that the aluminum layer is cut back from the desired island structure (more completely formed in subsequent processing), which is particularly as indicated by reference in numerals 20 and 18 in FIG. 3A. The presence of aluminum layer 22 satisfies the contact requirements, and since it is etched with the indium tin oxide covered by gate nitride, no "Swiss cheese" attack of pixel electrode layer 16 is observed.

Figure 4G:
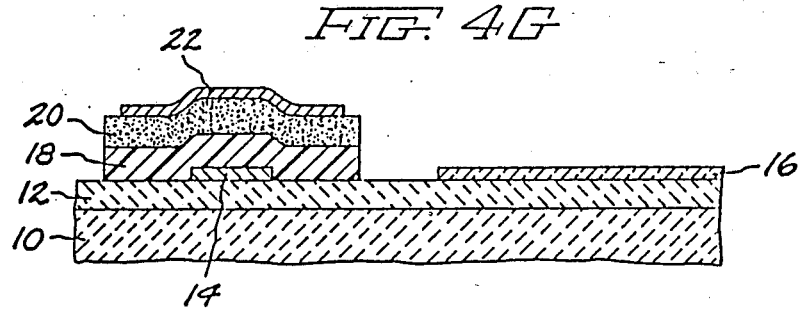

FIG. 4G illustrates the next step in the process in which the amorphous silicon and silicon nitride islands are patterned. This operation represents the fourth masking step. The mask employed may be the same mask as that employed to form the aluminum islands. In order to use the same mask, a double exposure is made in which the mask is shifted back and forth in the same diagonal direction twice to insure greater aluminum removal. However, in general, it is preferable to employ a separate mask for patterning the silicon and nitride portions of the island structure. The purpose of this cut back or set back for the aluminum layer is to prevent undercutting which could occur as a result of differential material etch rates for aluminum and the other island constituents. The plasma etchant employed to remove the silicon nitride and amorphous silicon layers do not attack the indium tin oxide layer.

FIG. 4H illustrates the next step in the process of the present invention in which a layer of molybdenum is deposited on the substrate. For example, a 3,000 Angstrom thick layer of molybdenum 24 may be so deposited. As shown in FIG. 4I, this layer is then patterned using a wet etch with a mixture of phosphoric, acetic and weak nitric acids (PAWN) with no attack of the indium tin oxide material. The PAWN etch also removes the small amount of aluminum from the channel between the source and drain pads. The molybdenum source-drain deposition forms a silicide around the edge of the island which results in gate and source drain leakage. However, this is eliminated by plasma etching of the exposed silicon surface (back channel etching) and the device is then deposited with a low temperature nitride for protection and passivation of the exposed silicon surface. See FIG. 4J.

From the above, it should be appreciated that the thin film FET and liquid crystal display device and process of the present invention solves the problem of electrode contact to amorphous silicon while at the same time maintaining material composition compatibility for simplified LCD device fabrication. In particular, it is seen that the essential parts of LCD device may be fabricated in a process employing only five masking steps. It is also seen that the process steps are carried out in a particular order with specified materials to ensure that degradation of the pixel electrode material does not occur. It is also seen that the apparatus and process of the present invention are such as to be compatible with a large variety of liquid crystal display systems and with a large variety of liquid crystal material. It should also be appreciated that the present invention is one which is readily fabricatable using relatively conventional VLSI processing methods so as to enable the reliable and high yield fabrication of responsive high resolution liquid crystal display devices.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. An active matrix liquid crystal display comprising:
   a pair of flat substrates, at least one of which is transparent;
   a quantity of liquid crystal material disposed and contained between said substrates;
   an array of indium tin oxide pixel electrodes disposed on said at least one substrate;
   at least one ground plane electrode disposed on the other one of said substrates, so that liquid crystal material is disposed between said pixel electrodes and said ground plane electrodes;
   a set of electrically conductive data lines;
   a set of electrically conductive gate lines;
   an array of inverted semiconductor switch elements associated with said pixel electrodes, each of said switch elements including a gate electrode electrically connected to said gate lines, said switch elements also including a silicon layer disposed over a gate insulation layer so as to form an island configuration and a layer of aluminum disposed over said silicon layer in each switch element, said aluminum layer having an insulative gap therein which is located over said gate electrode so as to define a field effect transistor with source, gate and drain, said switch element gate electrodes being connected to one of said gate lines, and said source and drain being connected via source and drain lines either to one of said data lines or said pixel electrodes through said aluminum layer, said drain lines and said gate lines comprising material other than aluminum.

2. The liquid crystal display of claim 1 in which said source lines and said drain lines comprise molybdenum.

3. The display of claim 1 in which said silicon layer comprises amorphous silicon.

4. A process for the fabrication of thin film field effect transistors in active matrix liquid crystal display devices, said process comprising the steps of:
  disposing a gate metallization layer pattern on an insulative substrate, said gate metal comprising titanium, said pattern including gate electrodes;
  disposing a pixel electrode pattern on said substrate, said pixel electrode material comprising indium tin oxide;
  disposing a protective insulative layer over said substrate including said gate metal pattern and said pixel electrode pattern;
  disposing a layer of silicon over said protective insulative layer;
  disposing a layer of aluminum over said silicon;
  patterning said aluminum layer to form islands of aluminum in contact with said silicon layer, said islands being disposed over said gate electrodes;
  patterning said protective insulative layer and said silicon layer so as to form islands substantially coextensive with said aluminum islands, whereby each island formed includes a protective layer, a silicon layer, and an aluminum layer;
  disposing a source and drain metallization layer over said substrate; and
  patterning said source and drain metallization layer and said aluminum layer so as to form field effect transistor devices.

5. The fabrication process of claim 4 in which said gate metallization layer pattern is disposed by vapor deposition and plasma etching.

6. The fabrication process of claim 4 in which said pixel electrode pattern is disposed by sputter deposition and wet etching.

7. The fabrication process of claim 4 in which said protective insulative layer is disposed by plasma enhanced chemical vapor deposition of silicon nitride.

8. The fabrication process of claim 4 in which aluminum layer is disposed by electron beam evaporation.

9. The fabrication process of claim 4 in which said source and drain metallization layer is disposed by sputtering.

10. The fabrication process of claim 4 in which said source and drain metallization layer patterning includes etching in a solution of phosphoric acid, acetic acid and weak nitric acid.

11. The fabrication process of claim 4 further including disposing a passivation layer over said substrate.

12. The fabrication process of claim 11 in which said passivation layer is formed by plasma enhanced chemical vapor deposition of silicon nitride.

13. The fabrication process of claim 4 in which said silicon and said protective insulative layer patterning produces islands on which said aluminum layer is set back from said island edges.

14. The method of claim 4 in which said protective insulative layer comprises silicon nitride.

15. The method of claim 4 in which said silicon layer comprises amorphous silicon.

16. The fabrication process of claim 15 in which said amorphous silicon is disposed by plasma enhanced chemical vapor deposition.

17. The method of claim 11 in which said passivation layer comprises silicon nitride.

* * * * *